United States Patent
Strandjord et al.

(10) Patent No.: US 9,389,081 B1
(45) Date of Patent: *Jul. 12, 2016

(54) THREE-LASER RESONATOR FIBER OPTIC GYROSCOPE WITH ENHANCED FREQUENCY REFERENCE CAVITY

(71) Applicant: Honeywell International Inc., Morristown, NJ (US)

(72) Inventors: Lee K. Strandjord, Tonka Bay, MN (US); Glen A. Sanders, Scottsdale, AZ (US); Tiequn Qiu, Glendale, AZ (US)

(73) Assignee: Honeywell International Inc., Morris Plains, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/690,148

(22) Filed: Apr. 17, 2015

(51) Int. Cl.
| | | |
|---|---|---|
| *G01C 19/72* | (2006.01) | |
| *G01C 19/64* | (2006.01) | |
| *H01S 5/10* | (2006.01) | |

(52) U.S. Cl.
CPC ............. *G01C 19/727* (2013.01); *G01C 19/64* (2013.01); *G01C 19/72* (2013.01); *H01S 5/1071* (2013.01)

(58) Field of Classification Search
CPC ...... G01C 19/727; G01C 19/72; G01C 19/66; G01C 19/64; H01S 5/1071
USPC ......................................................... 356/461
See application file for complete search history.

(56) References Cited

U.S. PATENT DOCUMENTS

| | | | |
|---|---|---|---|
| 7,388,671 B2 * | 6/2008 | Sanders | G01C 19/727 356/461 |
| 7,463,360 B2 * | 12/2008 | Hughes | G01C 19/727 356/461 |
| 7,751,055 B2 * | 7/2010 | Sanders | G01C 19/727 356/461 |
| 7,933,020 B1 | 4/2011 | Strandjord et al. | |
| 8,009,296 B2 | 8/2011 | Sanders et al. | |
| 8,446,590 B2 | 5/2013 | Sanders et al. | |
| 2007/0133003 A1 * | 6/2007 | Sanders | G01C 19/727 356/461 |
| 2007/0242276 A1 * | 10/2007 | Hughes | G01C 19/727 356/461 |

(Continued)

OTHER PUBLICATIONS

Sanders et al., "Symmetric Three-Laser Resonator Fiber Optic Gyroscope", U.S. Appl. No. 14/312,009, filed Jun. 23, 2014, pp. 1-25, Published in: US.

(Continued)

*Primary Examiner* — Tarifur Chowdhury
*Assistant Examiner* — Md M Rahman
(74) *Attorney, Agent, or Firm* — Fogg & Powers LLC

(57) ABSTRACT

A resonator fiber optic gyroscope comprises a master laser that emits a reference optical signal, a first slave laser that emits a first optical signal and is responsive to the reference optical signal through a first optical phase lock loop (OPLL), and a second slave laser that emits a second optical signal and is responsive to the reference optical signal through a second OPLL. A reference resonator in optical communication with the master laser receives the reference optical signal, and comprises a first fiber optic coil having a first cavity length. A gyro resonator, in optical communication with the first and second slave lasers, receives the first and second optical signals. The gyro resonator comprises a second fiber optic coil having a second cavity length longer than the first cavity length. The reference resonator has an operating frequency that substantially tracks with an operating frequency of the gyro resonator.

18 Claims, 3 Drawing Sheets

(56) References Cited

U.S. PATENT DOCUMENTS

| | | | |
|---|---|---|---|
| 2008/0137091 A1* | 6/2008 | Sanders | G01C 19/727 356/461 |
| 2011/0141477 A1* | 6/2011 | Sanders | G01C 19/727 356/461 |
| 2015/0369605 A1 | 12/2015 | Strandjord et al. | |
| 2016/0003619 A1 | 1/2016 | Strandjord et al. | |

OTHER PUBLICATIONS

Strandjord et al., "Resonantor Fiber Optic Gyroscope Employing Common Cavity Length Modulation Along With High Bandwidth Laser Stabilization", U.S. Appl. No. 14/325,006, filed Jul. 17, 2014, pp. 1-29, Published in: US.

* cited by examiner

THREE-LASER RESONATOR FIBER OPTIC GYROSCOPE WITH ENHANCED FREQUENCY REFERENCE CAVITY

BACKGROUND

The resonator fiber optic gyroscope (RFOG) has shown promise in meeting the needs of many navigation and inertial stabilization markets. Prior art teaches an RFOG design using the gyro resonator as a reference resonator to stabilize a master laser, and then the master laser stability is transferred to slave lasers using high speed optical phase lock loops. The reduced phase noise relative to the gyro resonator improves RFOG performance. A disadvantage of this approach is that the master laser beam must co-propagate with one of the slave laser beams used for rotation sensing. The beating between these two beams can cause rotation sensing errors and/or greatly increase the complexity of the design.

Prior approaches have employed a reference resonator to stabilize the master laser. Even though this method eliminates the problem with co-propagating beams, it has a disadvantage in that the reference resonator operating parameters do not track the gyro resonator over operating temperature. This is a serious issue for applications that require gyros without temperature control.

SUMMARY

A resonator fiber optic gyroscope comprises a master laser configured to emit a reference optical signal, a first slave laser configured to emit a first optical signal, the first slave laser responsive to the reference optical signal through a first optical phase lock loop, and a second slave laser configured to emit a second optical signal, the second slave laser responsive to the reference optical signal through a second optical phase lock loop. A reference resonator is in optical communication with the master laser and is configured to receive the reference optical signal. The reference resonator comprises a first fiber optic coil having a first cavity length. A gyro resonator is in optical communication with the first slave laser and the second slave laser, and is configured to receive the first and second optical signals. The gyro resonator comprises a second fiber optic coil having a second cavity length that is longer than the first cavity length of the first fiber optic coil. The reference resonator has an operating frequency that substantially tracks with an operating frequency of the gyro resonator.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A three-laser resonator fiber optic gyroscope (RFOG) is provided that includes an enhanced frequency reference cavity. The RFOG employs a reference ring resonator as the frequency reference cavity, which has a similar construction as a gyro ring resonator of the RFOG. This ensures that the operating frequency of the reference ring resonator substantially and automatically tracks the operating frequency of the gyro ring resonator.

The reference ring resonator of the RFOG includes a first fiber optic coil having a first cavity length. The gyro ring resonator includes a second fiber optic coil having a second cavity length that is much longer than the first cavity length of the fiber optic coil of the reference ring resonator. This configuration is needed to obtain the required laser stabilization loop bandwidth. Because of this, it is not apparent that a reference ring resonator of such construction can have an operating frequency that automatically tracks that of the gyro ring resonator over an operating temperature as in the present RFOG. As long as the optical path-length thermal expansion coefficient of the reference ring resonator cavity is matched to that of the gyro ring resonator within a certain tolerance, the reference ring resonator operating frequency will track that of the gyro ring resonator even though the reference ring resonator cavity length is much shorter.

When operating temperature gradients of the RFOG are significant, one or more small heaters can optionally be implemented on the gyro ring resonator or the reference ring resonator along with a control loop to ensure that the temperature gradients are managed to acceptable levels. Furthermore, the one or more small heaters can help provide relaxation to the required tolerances on optical path-length thermal expansion coefficients.

Further details of the present RFOG are described hereafter with reference to the drawings.

Figure 1:
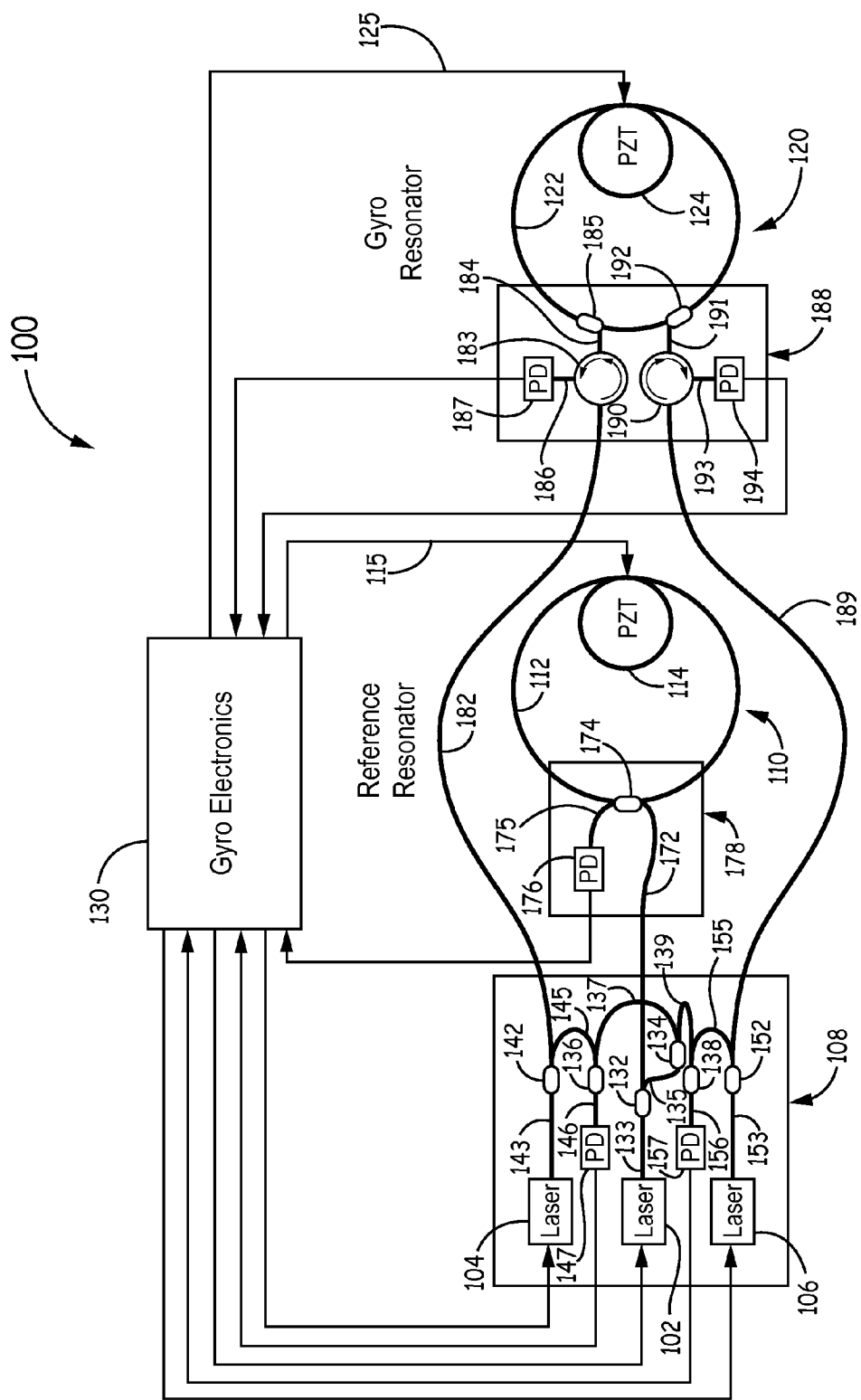
FIG. 1 is a schematic block diagram of a resonator fiber optic gyroscope (RFOG) according to one embodiment.

FIG. 1 illustrates an RFOG 100 according to one embodiment. The RFOG 100 generally includes a master laser 102, a first slave laser 104, and a second slave laser 106. The master laser 102 is in optical communication with a ring reference resonator 110, and slave lasers 104, 106 are in optical communication with a ring gyro resonator 120. A gyro electronics unit 130 is in operative communication with all of the foregoing components of RFOG 100.

The gyro resonator 120 is operatively coupled to resonance tracking electronics in gyro electronics unit 130. The reference resonator 110 is operatively coupled to the resonance tracking electronics to adjust a resonance frequency of reference resonator 110 to substantially correspond with a resonance frequency of gyro resonator 120.

In one embodiment, master laser 102 and slave lasers 104, 106 can be implemented as a multi frequency laser source (MFLS), such as distributed feedback lasers (DFBs) that are part of an integrated photonics chip 108 such as a silicon photonics (SiP) chip. The DFB lasers can operate without thermoelectric coolers, and provide enough optical power without using optical amplifiers.

In one embodiment, reference resonator 110 includes a first fiber optic coil 112 that is partially wound around a core such as an aluminum core. A first phase modulator 114 is optically coupled to reference resonator 110 and comprises a first piezoelectric core, such as lead zirconate titanate (PZT), which is wound with a portion of fiber optic coil 112 to produce a first piezoelectric transducer. A frequency command signal 115 is output from gyro electronics unit 130 to phase modulator 114 to automatically adjust a resonance frequency of reference resonator 110 to substantially correspond with a resonance frequency of gyro resonator 120.

In one embodiment, gyro resonator 120 includes a fiber optic coil 122 that is partially wound around a core such as an aluminum core. A second phase modulator 124 is optically coupled to gyro resonator 120 and comprises a second piezoelectric core, such as PZT, which is wound with a portion of fiber optic coil 122 to produce a second piezoelectric transducer. A modulation signal 125 is output from gyro electronics unit 130 to phase modulator 124 to provide a common cavity modulation frequency to gyro resonator 120. The common cavity modulation is used for detecting and tracking the clockwise (CW) and counter-clockwise (CCW) resonance frequencies of gyro resonator 120.

The reference resonator 110 has a similar construction as gyro resonator 120. For example, fiber optic coils 112 and 122 can have substantially the same optical path-length thermal expansion coefficients, and can be composed of the same optical material with the same construction such as hollow core or solid core fibers. In one implementation, the piezoelectric cores of the first and second phase modulators 114, 124 are composed of the same piezoelectric material.

The reference resonator 110 has a much shorter fiber optic coil (e.g., up to about 1 m) than the fiber optic coil of gyro resonator 120 (e.g., about 10-200 m). In one embodiment the cavity length of gyro resonator 120 is longer than the cavity length of reference resonator 110 by a ratio of at least about 10 to 1. In another embodiment, the cavity length of gyro resonator 120 is longer than the cavity length of reference resonator 110 by a ratio of up to about 200 to 1.

The master laser 102 generates a reference optical signal that is directed to an optical coupler 132 through an optical waveguide 133. The optical coupler 132 directs a portion of the reference optical signal to an optical coupler 134 through an optical waveguide 135. The optical coupler 134 directs a portion of the reference optical signal to an optical coupler 136 through an optical waveguide 137, and directs a portion of the reference optical signal to an optical coupler 138 through an optical waveguide 139.

The first slave laser 104 generates a first optical signal that is directed to an optical coupler 142 through an optical waveguide 143. In one embodiment, the first optical signal from slave laser 104 is a CW optical signal in gyro resonator 120. The optical coupler 142 directs a portion of the first optical signal to optical coupler 136 through an optical waveguide 145. The optical coupler 136 combines the portion of the first optical signal with the portion of the reference optical signal from optical waveguide 137. This combined optical signal is transmitted through an optical waveguide 146 to a photodetector (PD) 147 such as a photodiode, which converts the combined optical signal to an electrical signal. This electrical signal is transmitted to an input of gyro electronics unit 130, which feeds back a signal to slave laser 104 to form an optical phase lock loop (OPLL) that phase locks slave laser 104 to master laser 102 with a controllable frequency offset.

The second slave laser 106 generates a second optical signal that is directed to an optical coupler 152 through an optical waveguide 153. In one embodiment, the second optical signal from slave laser 106 is a CCW optical signal in gyro resonator 120. The optical coupler 152 directs a portion of the second optical signal to optical coupler 138 through an optical waveguide 155. The optical coupler 138 combines the portion of the second optical signal with the portion of the reference optical signal from optical waveguide 139. This combined optical signal is transmitted through an optical waveguide 156 to a photodetector 157, which converts the combined optical signal to an electrical signal. This electrical signal is transmitted to an input of gyro electronics unit 130, which feeds back a signal to slave laser 106 to form an OPLL that phase locks slave laser 106 to master laser 102 with a controllable frequency offset.

In one embodiment, the foregoing optical couplers, waveguides, and photodetectors associated with the master and slave lasers can be implemented on SiP chip 108, such as shown in FIG. 1.

The optical coupler 132 also directs a portion of the reference optical signal to reference resonator 110 through an optical waveguide 172 coupled between optical coupler 132 and an optical coupler 174 associated with reference resonator 110. A portion of the resonator optical signal in reference resonator 110 is directed by optical coupler 174 through an optical waveguide 175 to a photodetector 176, which converts the resonator optical signal to an electrical signal. This electrical signal is sent to an input of gyro electronics unit 130. An output signal from gyro electronics unit 130 is directed to an input of master laser 102 as part of a Pound-Drever-Hall (PDH) loop for modulating and tuning the frequency of the reference optical signal.

In one embodiment, optical coupler 174, waveguides 172, 175, and photodetector 176 can be implemented on a first optical bench chip 178, such as a silicon optical bench (SiOB), as shown in FIG. 1.

The optical coupler 142 also directs a portion of the first optical signal to gyro resonator 120 through an optical waveguide 182 such as an optical fiber. In one embodiment, a first optical circulator 183 is located along the optical path between optical coupler 142 and gyro resonator 120. The optical circulator 183 directs a portion of the first optical signal from optical waveguide 182 through an optical waveguide 184 to an optical coupler 185, which couples the first optical signal into gyro resonator 120 in the clockwise direction.

The optical coupler 152 also directs a portion of the second optical signal to gyro resonator 120 through an optical waveguide 189 such an optical fiber. In one embodiment, a second optical circulator 190 is located along the optical path between optical coupler 152 and gyro resonator 120. The optical circulator 190 directs a portion of the second optical signal from optical waveguide 189 through an optical waveguide 191 to an optical coupler 192, which couples the second optical signal into gyro resonator 120 in the counter-clockwise direction.

The optical coupler 185 also directs a portion of the second optical signal from gyro resonator 120 to circulator 183, which directs the second optical signal to a photodetector 187 through an optical waveguide 186. The photodetector 187 converts the second optical signal to an electrical signal that is sent to an input of gyro electronics unit 130 to control the offset frequency of the optical phase lock loop for tuning the frequency of the first optical signal.

The optical coupler 192 also directs a portion of the first optical signal from gyro resonator 120 to circulator 193, which directs the first optical signal to a photodetector 194 through an optical waveguide 193. The photodetector 194 converts the first optical signal to an electrical signal that is sent to an input of gyro electronics unit 130 to control the offset frequency of the optical phase lock loop for tuning the frequency of second optical signal.

In one embodiment, optical circulator 183, optical coupler 185, optical waveguides 184, 186, and photodetector 187 can be implemented on a second optical bench chip 188, such as a silicon optical bench (SiOB), as shown in FIG. 1. In addition, optical circulator 190, optical coupler 192, optical waveguides 191, 193, and photodetector 194 can also be implemented on optical bench chip 188.

Figure 2:
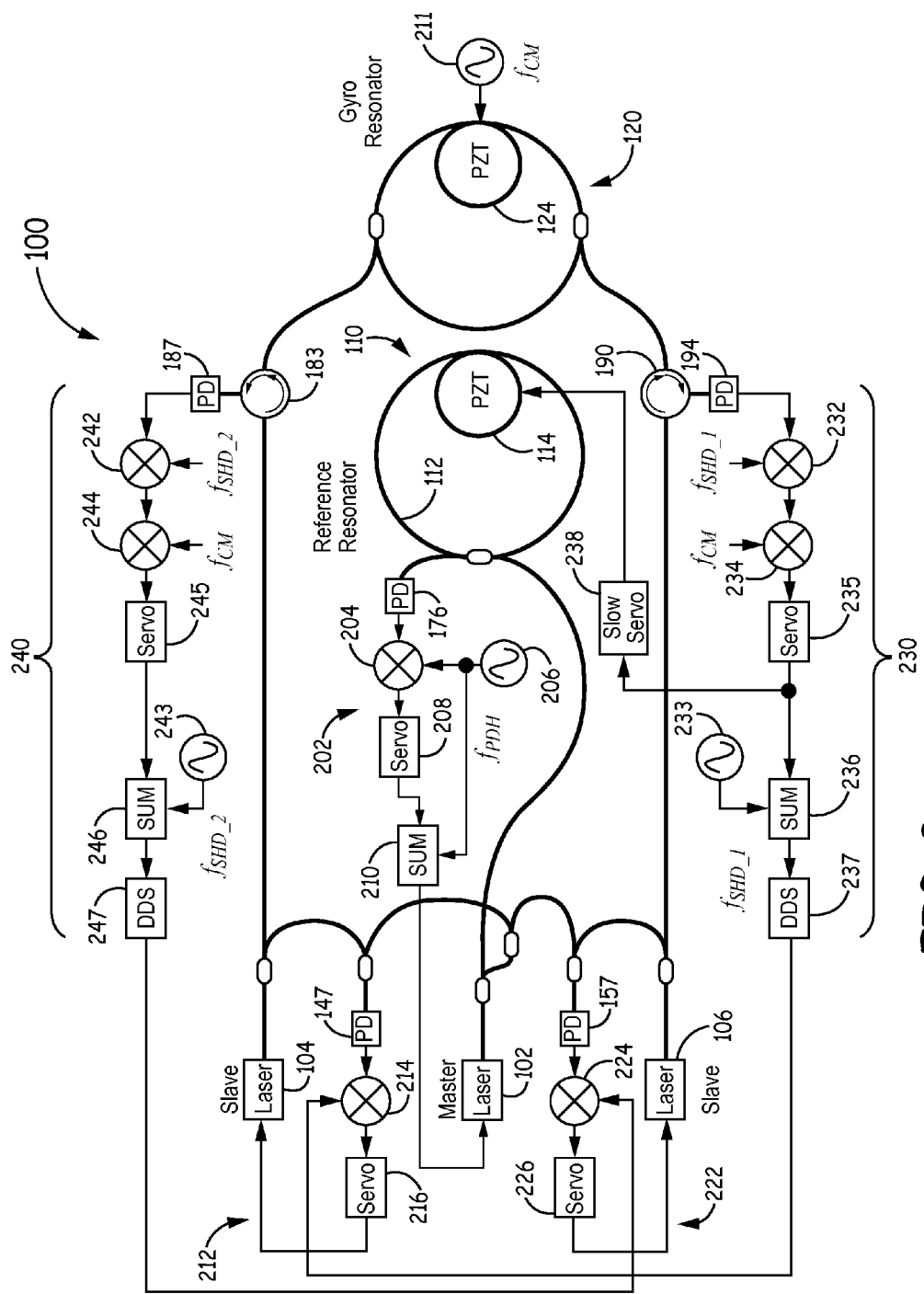
FIG. 2 is a schematic block diagram showing additional features of the RFOG of FIG. 1.

FIG. 2 illustrates further details of the electronic components associated with RFOG 100 and which are part of gyro electronics unit 130. A PDH loop 202 for master laser 102 includes electronic components that comprise a mixer 204, which combines the electrical signal from photodetector 176 with a PDH modulation frequency ($f_{PDH}$) produced by a sine wave generator 206. The mixer 204 outputs a signal to a servo 208, which controls the frequency of master laser 102 to lock master laser 102 onto a resonance frequency of reference resonator 110. The servo 208 outputs a signal to a summer 210, which also receives the PDH modulation frequency from sine wave generator 206. An output signal from summer 210 is directed to an input of master laser 102 for modulating and tuning the frequency of the reference optical signal generated by master laser 102.

In one embodiment, a sine wave generator 211 provides a common cavity modulation frequency ($f_{cm}$) to phase modulator 124 in gyro resonator 120 to detect and track the CW and CCW resonance frequencies of gyro resonator 120.

An OPLL 212 for slave laser 104 includes electronic components that comprise a mixer 214, which combines the electrical signal from photodetector 147 with a signal output from a first set of tracking electronics 230 discussed further hereafter. A servo 216 receives an output signal form mixer 214. An output signal from servo 216 is directed to an input of slave laser 104 for tuning the frequency of the first optical signal generated by slave laser 104.

An OPLL 222 for slave laser 106 includes electronic components that comprise a mixer 224, which combines the electrical signal from photodetector 157 with a signal output from a second set of tracking electronics 240 discussed further hereafter. A servo 226 receives an output signal form mixer 224. An output signal from servo 226 is directed to an input of slave laser 106 for tuning the frequency of the second optical signal generated by slave laser 106.

The first set of tracking electronics 230 includes a first mixer 232, which combines the electrical signal from photodetector 194 with a sideband heterodyne frequency ($f_{SHD\_1}$) produced by a sine wave generator 233. An output signal from first mixer 232 is sent to a second mixer 234, which also receives the common cavity modulation frequency produced by sine wave generator 211. The mixer 234 outputs a signal to a first servo 235, which outputs a frequency command signal to a summer 236. The summer 236 also receives the sideband heterodyne frequency produced by sine wave generator 233. An output signal from summer 236 is sent to a direct digital synthesizer (DDS) 237, which outputs an analog frequency reference, having a frequency proportional to the frequency command signal outputted by servo 235, to mixer 214 to provide for on resonance tuning of slave laser 104.

The frequency command signal output from first servo 235 is also tapped off and sent to a second servo 238 such as a slow servo, which feeds an electrical voltage signal back to phase modulator 114. This adjusts the resonance frequency of reference resonator 110 such that it aligns with the resonance frequency of gyro resonator 120 to reduce relatively small deviations between the two resonance frequencies caused by thermal and vibration effects along with build tolerances.

In an alternative embodiment, second servo 238 can also be coupled to at least one optional heater located on fiber optic coil 112 to provide for thermal tuning of reference resonator 110 in a thermal control loop. The heater provides additional tuning range for reference resonator 110 to standoff a temperature gradient during operation along with overcoming some differences in optical thermal expansion coefficients between the two resonators. The thermal control loop has a greater range than the control loop involving phase modulator 114. However, the control loop involving phase modulator 114 can be much faster than the thermal control loop. The two loops can be blended in a way where the thermal control loop takes care of resonance frequency deviations that are large and at low frequency (e.g., below 1 Hz), and the control loop feeding back to phase modulator 114 takes care of smaller but higher frequency deviations (e.g., above 1 Hz to about 1-10 kHz). An exemplary embodiment of an RFOG that employs differential temperature control is described hereafter with respect to FIG. 3.

As shown in FIG. 2, the second set of tracking electronics 240 includes a first mixer 242, which combines the electrical signal from photodetector 187 with a sideband heterodyne frequency ($f_{SHD\_2}$) produced by a sine wave generator 243. An output signal from first mixer 242 is sent to a second mixer 244, which also receives the common cavity modulation frequency produced by sine wave generator 211. The mixer 244 outputs a signal to a servo 245, which outputs a frequency command signal to a summer 246. The summer 246 also receives the sideband heterodyne frequency produced by sine wave generator 243. An output signal from summer 246 is sent to a DDS 247, which outputs an analog frequency reference, having a frequency proportional to the frequency command signal outputted by servo 245, to mixer 224 to provide for on resonance tuning of slave laser 106.

Figure 3:
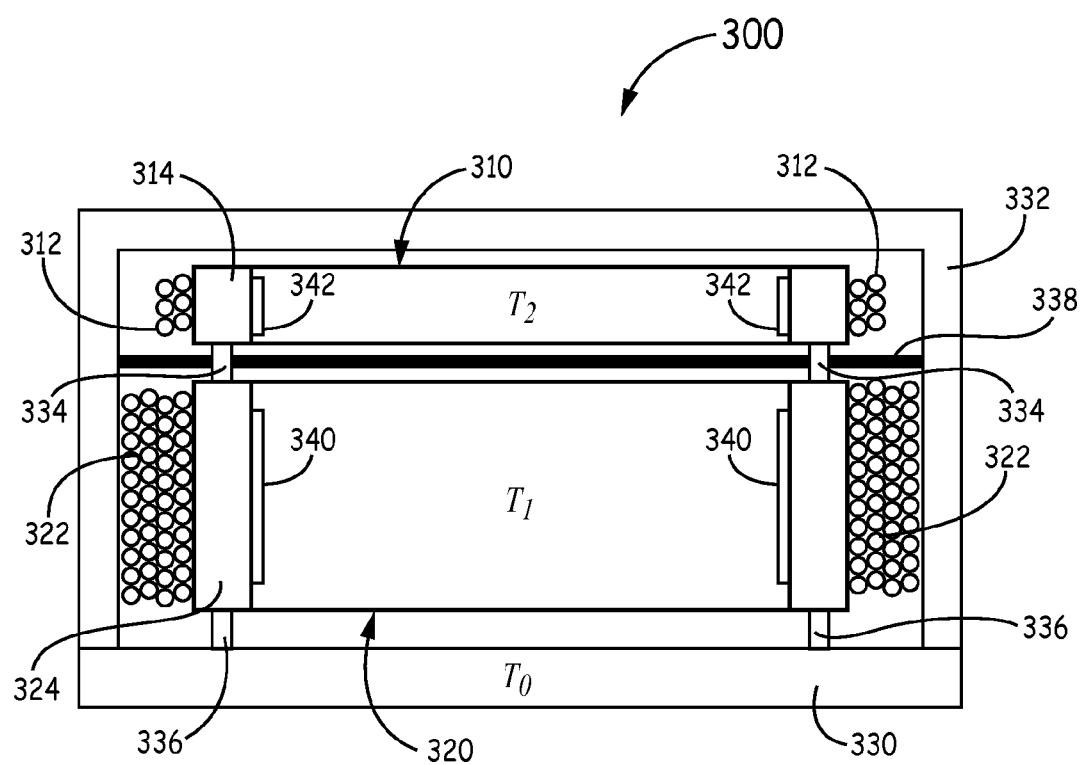
FIG. 3 is a block diagram of an RFOG according to another embodiment, which employs differential temperature control.

FIG. 3 illustrates an RFOG 300 according to another embodiment, which employs differential temperature control to compensate for mismatches in resonator thermal coefficients of expansion (TCEs). The RFOG 300 generally includes a reference resonator 310 and a gyro resonator 320, which are mounted in a gyro case 330 and enclosed by a gyro cover 332. The reference resonator 310 includes a fiber optic coil 312 wound around an exterior surface of a reference resonator hub 314. The gyro resonator 320 includes a fiber optic coil 322 wound around an exterior surface of a gyro resonator hub 324. The reference resonator hub 314 and gyro resonator hub 324 are separated from each other by a first set of thermal isolating spacers 334. The gyro resonator hub 324 is spaced apart from gyro case 330 by a second set of thermal isolating spacers 336. A heat convection barrier 338 is interposed between reference resonator 310 and gyro resonator 320.

One or more heaters 340 are attached to an interior surface of gyro resonator hub 324. One or more heaters 342 are also attached to an interior surface of reference resonator hub 314. The heater 340 is configured to a produce a first temperature ($T_1$) in gyro resonator 320. The heater 342 is configured to produce a second temperature ($T_2$) in reference resonator 310 that is different than the first temperature. The first and second temperatures each differ from an initial temperature ($T_0$) of gyro case 330. The temperatures produced by heaters 340 and 342 can be controlled by the gyro electronics to produce differential temperatures between reference resonator 310 and gyro resonator 320 to compensate for mismatches in the TCE of each resonator.

The following equations show how the resonance frequencies of the gyro resonator and the reference resonator of the present RFOG track with respect to temperature. The gyro resonator resonance frequency ($f_{m,1}$) is defined by the following equation:

$$f_{m,1} = \frac{m_1 c}{l_1} \quad (1)$$

where $m_1$ is the resonance mode number of the gyro resonator coil, $l_1$ is the optical path length of the gyro resonator coil, and c is the speed of light in vacuum. The reference resonator resonance frequency ($f_{m,2}$) is defined by the following equation:

$$f_{m,2} = \frac{m_2 c}{l_2} \quad (2)$$

where $m_2$ is the resonance mode number of the reference resonator coil, and $l_2$ is the optical path length of the reference resonator coil. The optical path length dependence on temperature for the gyro resonator coil is defined by the following equation:

$$l_1 = l_{0,1} + l_{0,1} \alpha_{l,1} T \quad (3)$$

where $l_{0,1}$ is the optical path length at T=0° C., $\alpha_{l,1}$ is the optical thermal expansion coefficient for the gyro resonator coil, and T is the coil temperature. The optical path length dependence on temperature for the reference resonator coil is defined by the following equation:

$$l_2 = l_{0,2} + l_{0,2} \alpha_{l,2} T \quad (4)$$

where $l_{0,2}$ is the optical path length at T=0° C., and $\alpha_{l,2}$ is the optical thermal expansion coefficient for the reference resonator coil. Substitution of terms in the foregoing equations gives:

$$f_{m,1} = \frac{m_1 c}{l_{0,1}(1 + \alpha_{l,1} T)} \quad (5)$$

$$f_{m,2} = \frac{m_2 c}{l_{0,2}(1 + \alpha_{l,2} T)}. \quad (6)$$

The base resonance frequency ($f_{0,1}$) for the gyro resonator (when T=0) is defined by the following expression:

$$f_{0,1} \equiv \frac{m_1 c}{l_{0,1}}. \quad (7)$$

The base resonance frequency ($f_{0,2}$) for the reference resonator is defined by the following expression:

$$f_{0,2} \equiv \frac{m_2 c}{l_{0,2}}. \quad (8)$$

The optical thermal expansion coefficients are equalized using the following expression:

$$\alpha_{l,2} = \alpha_{l,1} = \alpha_l. \quad (9)$$

Substitution of terms in the foregoing equations gives:

$$f_{m,1} = f_{0,1} \frac{1}{(1 + \alpha_l T)} \quad (10)$$

$$f_{m,2} = f_{0,2} \frac{1}{(1 + \alpha_l T)}. \quad (11)$$

Since the slave laser frequency is determined by the master laser and is very close to the master laser, the slave laser can be locked onto the same resonance frequency as the master laser as indicated in the following expression:

$$f_{0,1} = f_{0,2} = f_0. \quad (12)$$

Substitution of terms gives:

$$f_{m,1} = f_0 \frac{1}{(1 + \alpha_l T)} \quad (13)$$

$$f_{m,2} = f_0 \frac{1}{(1 + \alpha_l T)} \quad (14)$$

where $f_{m,1} = f_{m,2}$. This defines the resonance frequencies that will track with temperature.

There are many reasons why it is desirable to have the reference resonator coil length shorter than the gyro resonator coil length. One reason is that the reference resonator with a shorter coil length can provide better laser stabilization at higher frequencies. Another advantage is a shorter reference resonator coil can lower the cost of the RFOG. To show that the resonance frequencies of the two resonators can be made track each other over temperature, an example is shown where the length of the reference resonator is $\frac{1}{5}^{th}$ the length of the gyro resonator, thus:

$$l_{0,2} = l_{0,1}/5. \quad (15)$$

Equations 7 and 8 above show the relationship between the base resonance frequencies and the mode number. Substituting equations 7, 8, and 15 into equation 12 gives:

$$\frac{m_1 c}{l_{0,1}} = \frac{m_2 c}{l_{0,1/5}}. \quad (16)$$

Equation 16 can be simplified to give:

$$m_1 = 5 m_2. \quad (17)$$

Equation 17 shows that by locking the lasers onto the same resonance frequency, they are also locked onto different mode numbers when the two resonators have different lengths. By locking the slave lasers to the same resonance frequencies as the master laser, the correct mode number occurs automatically. The master laser is locked onto the reference resonator, and the slave lasers are locked onto the gyro resonator. This assumes that the slave lasers are locked onto the master laser with no frequency offset. While in principal this can be done, it is difficult to achieve in practice. Thus, the slave lasers can be locked onto the master laser with about 100 MHz frequency offset, for example.

In some embodiments, the slave lasers are locked on adjacent resonances, which introduce a small error in how the gyro resonator resonances will track with the reference resonator resonances. This requires evaluating the size of the gyro/reference resonator resonance tracking error with temperature due to selecting different resonance modes. Starting with equations 10 and 11 above, before selecting the resonance frequencies to operate the slave lasers and master laser, the slave lasers are locked $N_{FSR}$ away from the gyro resonance frequency that matches the reference resonator resonance frequency, where FSR is the free spectral range. The following expressions are defined:

$$f_{0,2} = f_0 \quad (18)$$

$$f_{0,1} = f_0 + N_{FSR} \cdot f_{FSR,1} \quad (19)$$

where $f_{FSR,1}$ is the free spectral range of the gyro resonator. Substitution of terms gives:

$$f_{m,1} = f_0 \frac{1}{(1+\alpha_l T)} + N_{FSR} \cdot f_{FSR} \frac{1}{(1+\alpha_l T)} \quad (20)$$

$$f_{m,2} = f_0 \frac{1}{(1+\alpha_l T)}. \quad (21)$$

The difference in the resonance frequencies gives how much they separate with temperature:

$$f_{m,2} - f_{m,1} = f_{FSR} \frac{1}{(1+\alpha_l T)}. \quad (22)$$

The FSR also changes with temperature, but to first order consider it constant to determine the magnitude of the frequency tracking error over a wide temperature range, such as about −40° C. to about 80° C., which is roughly the commercial aviation temperature range. Assume hollow core fiber wound on a low expansion coefficient material such as lead zirconate titanate (TCE about 3 ppm/° C.), which is the material of piezoelectric transducers. Also assume that the slave laser is locked one FSR away, or $N_{FSR}=1$, and that a FSR=10 MHz, which is a resonator with 30 meters of hollow core fiber. The resonance tracking error can be estimated as follows:

$$\Delta f_{error} = f_{m,2} - f_{m,1}(T=-40 \text{ deg C.}) - f_{m,2} - f_{m,1}(T=80 \text{ deg C.}) \quad (23)$$

where $\Delta f_{error} \sim 3.6$ kHz. Thus, over the operating temperature range of −40° C. to 80° C., the two resonator resonance frequencies will separate by about 3.6 kHz, when the slave laser has a 10 MHz frequency offset from the master laser. This is very small compared to the frequency tuning range (>10 MHz) provided by the PZT that the reference resonator coil is wound on. The reference resonator PZT can easily make up for this error and keep the reference and gyro resonator resonance frequencies well matched over temperature. For a 100 MHz frequency offset the separation will be about 36 kHz. The PZT in the reference resonator can tune the reference resonator resonance frequency by more than 10 MHz, so it can easily compensate for the 36 kHz separation and keep the two resonance frequencies the same. A small heater on either the reference resonator or the gyro resonator can also keep the resonance frequencies the same.

The resonance tracking error can increase when thermal coefficients of expansion (TCEs) of the fiber are not matched within a certain tolerance. The optical thermal expansion coefficients can be defined as:

$$\alpha_{l,2} \equiv \alpha_l \quad (24)$$

$$\alpha_{l,1} \equiv \alpha_l + \alpha_\Delta \quad (25)$$

$$f_{m,1} = f_{0,1} \frac{1}{(1+(\alpha_l + \alpha_\Delta)T)} \quad (26)$$

$$f_{m,2} = f_{0,2} \frac{1}{(1+\alpha_l T)}. \quad (27)$$

With the slave lasers locked $N_{FSR}$ away from the gyro resonance frequency that matches the reference resonator resonance frequency, the following parameters are defined:

$$f_{0,2} = f_0 \quad (28)$$

$$f_{0,1} = f_0 + N_{FSR} \cdot f_{FSR,1} \quad (29)$$

where $f_{FSR,1}$ is the free spectral range of the gyro resonator. Substitution of terms gives:

$$f_{m,1} = f_0 \frac{1}{(1+(\alpha_l + \alpha_\Delta)T)} + N_{FSR} \cdot f_{FSR} \frac{1}{(1+\alpha_l T)} \quad (30)$$

$$f_{m,2} = f_0 \frac{1}{(1+\alpha_l T)}. \quad (31)$$

Equations 30 and 31 can be expanded in a Taylor series, and since $\alpha_e T \ll 1$ only the linear terms are needed for a good approximation:

$$F_{m,1} \approx f_0 - f_0(\alpha_l + \alpha_\Delta)T + N_{FSR} \cdot f_{FSR} (\alpha_l + \alpha_\Delta) T \quad (32)$$

$$f_{m,2} \approx f_0 - f_0 \alpha_l T. \quad (33)$$

Since $N_{FSR} \cdot f_{FSR} \ll f_0$, therefore:

$$f_{m,1} \approx f_0 - f_0(\alpha_l + \alpha_\Delta)T \quad (34)$$

$$f_{m,2} - f_{m,1} = f_0 \alpha_\Delta T \quad (35)$$

where $f_0 \approx 1.94$ THz. For RFOGs using a wavelength of 1.55 um:

$$\Delta f_{error} = f_{m,2} - f_{m,1}(T=80 \text{ deg C.}) - f_{m,2} - f_{m,1}(T=-40 \text{ deg C.}). \quad (36)$$

For $\alpha_\Delta = 0.1 \cdot \alpha_l$, $\Delta f_{error} \sim 7$ GHz; for $\alpha_\Delta = 0.01 \cdot \alpha_l$, $\Delta f_{error} \sim 700$ MHz; for $\alpha_\Delta = 0.001 \cdot \alpha_l$, $\Delta f_{error} \sim 70$ MHz. A 7 GHz error and a 700 MHz error will probably be too much for the reference resonator PZT to compensate. While the reference resonator PZT can possibly compensate for a 70 MHz error, matching the TCE to within 0.1% may be challenging and expensive to do in manufacturing.

In some embodiments, a small temperature control can be used to keep the resonance frequencies equalized during operation of the RFOG. For example, one or more small heaters can be coupled to each resonator to provide a small temperature difference between the two resonators to keep the resonance frequencies the same, thus relaxing the requirement on matching the thermal expansion coefficients. The following expressions are defined:

$$f_{m,1} \approx f_0 - f_0(\alpha_I + \alpha_\Delta)T_1 \quad (37)$$

$$f_{m,2} \approx f_0 - f_0 \alpha_I T_2. \quad (38)$$

With $T_1 = T$, and $T_2 = T + \Delta T$, substitution of terms gives:

$$f_{m,1} = f_0 - f_0 - f_0 \alpha_I T - f_0 \alpha_\Delta T \quad (39)$$

$$f_{m,2} = f_0 - f_0 \alpha_I T - f_0 \alpha_I \Delta T \quad (40)$$

$$f_{m,2} - f_{m,1} = f_0(\alpha_\Delta T - \alpha_I \Delta T). \quad (41)$$

To keep the two resonance frequencies the same, $\Delta T$ needs to be adjusted to keep $(\alpha_\Delta T - \alpha_I \Delta T) = 0$. That is:

$$\Delta T = \frac{\alpha_\Delta}{\alpha_I} T. \quad (42)$$

The entire range of T is about 120° C. If the TCEs are matched to within about 10%, then $\Delta T$ only needs to be 12° C. If heaters are put on both resonator coils, then the $\Delta T$ for each resonator needs to be only 6° C. An advantage of putting heaters on both resonator coils is that cooling is not required to make one coil temperature either higher or lower than the other coil. Cooling would require the use of thermal electric coolers, which can be expensive and require a lot of electrical power. If the TCEs are matched to within about 1%, the temperature difference between the two coils drops to 1.2° C., which can be done inexpensively and with very little electrical power. If the thermal resistance between the coils is 10° C./Watt, which is reasonable in a low cost design, the electrical power required for a differential temperature of 1.2° C. is only 0.12 W.

Example Embodiments

Example 1 includes a resonator fiber optic gyroscope (RFOG), comprising: a master laser configured to emit a reference optical signal; a first slave laser configured to emit a first optical signal, the first slave laser responsive to the reference optical signal through a first optical phase lock loop; a second slave laser configured to emit a second optical signal, the second slave laser responsive to the reference optical signal through a second optical phase lock loop; a reference resonator in optical communication with the master laser and configured to receive the reference optical signal, the reference resonator comprising a first fiber optic coil having a first cavity length; and a gyro resonator in optical communication with the first slave laser and the second slave laser and configured to receive the first and second optical signals, the gyro resonator comprising a second fiber optic coil having a second cavity length that is longer than the first cavity length of the first fiber optic coil; wherein the reference resonator has an operating frequency that substantially tracks with an operating frequency of the gyro resonator.

Example 2 includes the RFOG of Example 1, wherein the second cavity length is longer than the first cavity length by a ratio of at least about 10.

Example 3 includes the RFOG of Example 1, wherein the second cavity length is longer than the first cavity length by a ratio of up to about 200.

Example 4 includes the RFOG of any of Examples 1-3, wherein the first and second fiber optic coils have substantially the same thermal expansion coefficient.

Example 5 includes the RFOG of Example 4, wherein the first and second fiber optic coils are composed of the same optical material and have the same construction.

Example 6 includes the RFOG of Example 5, further comprising: a first phase modulator comprising a first piezoelectric core wound with a portion of the first fiber optic coil of the reference resonator; and a second phase modulator comprising a second piezoelectric core wound with a portion of the second fiber optic coil of the gyro resonator; wherein the first and second piezoelectric cores are composed of the same piezoelectric material.

Example 7 includes the RFOG of any of Examples 1-6, wherein the master laser, the first slave laser, and the second slave laser are implemented in a multi frequency laser source.

Example 8 includes the RFOG of Example 7, wherein the multi frequency laser source comprises a set of distributed feedback lasers incorporated in an integrated photonics chip.

Example 9 includes the RFOG of Example 8, wherein the reference resonator is in optical communication with the master laser through a first optical bench chip.

Example 10 includes the RFOG of Example 9, wherein the gyro resonator is in optical communication with the first and second slave lasers through a second optical bench chip.

Example 11 includes the RFOG of any of Examples 1-10, wherein the first optical signal from the first slave laser is a clockwise (CW) optical signal in the gyro resonator, and the second optical signal from the second slave laser is a counter-clockwise (CCW) optical signal in the gyro resonator.

Example 12 includes the RFOG of Example 11, further comprising a gyro electronics unit in operative communication with each of the master laser, the first slave laser, the second slave laser, the reference resonator, and the gyro resonator.

Example 13 includes the RFOG of Example 12, wherein a reflected optical signal from the reference resonator is directed to a feedback laser stabilization loop for the master laser that includes a Pound-Drever-Hall (PDH) servo modulation frequency scheme in the gyro electronics unit.

Example 14 includes the RFOG of Example 13, wherein the gyro resonator is operatively coupled to a CW resonance tracking electronics module and a CCW resonance tracking electronics module that are in the gyro electronics unit.

Example 15 includes the RFOG of Example 14, wherein the operating frequency of the reference resonator automatically tracks the operating frequency of the gyro resonator.

Example 16 includes the RFOG of any of Examples 14-15, wherein the reference resonator is operatively coupled to the CW resonance tracking electronics module to adjust a resonance frequency of the reference resonator to substantially correspond with a resonance frequency of the gyro resonator.

Example 17 includes the RFOG of Example 16, wherein the CW resonance tracking electronics module includes a first servo that outputs a frequency command signal that is directed to an input of a second servo, which outputs an electrical voltage signal to the first phase modulator to adjust the resonance frequency of the reference resonator.

Example 18 includes the RFOG of any of Examples 1-17, further comprising one or more heaters operatively coupled with the first fiber optic coil to provide for thermal tuning of the reference resonator with respect to a temperature gradient during operation of the RFOG.

Example 19 includes the RFOG of any of Examples 1-18, further comprising one or more heaters operatively coupled with the second fiber optic coil to provide for thermal tuning of the gyro resonator with respect to a temperature gradient during operation of the RFOG.

Example 20 includes an RFOG comprising: a master laser that emits a reference optical signal; a first slave laser that emits a CW optical signal, the first slave laser responsive to the reference optical signal through a CW optical phase lock loop; a second slave laser that emits a CCW optical signal, the second slave laser responsive to the reference optical signal through a CCW optical phase lock loop; a reference resonator in optical communication with the master laser and configured to receive the reference optical signal, the reference resonator comprising a first fiber optic coil having a first cavity length; and a gyro resonator in optical communication with the first slave laser and the second slave laser, the gyro resonator configured to receive the CW optical signal and the CCW optical signal, the gyro resonator comprising a second fiber optic coil having a second cavity length that is longer than the first cavity length of the first fiber optic coil; a first phase modulator comprising a first piezoelectric core wound with a portion of the first fiber optic coil of the reference resonator; a second phase modulator comprising a second piezoelectric core wound with a portion of the second fiber optic coil of the gyro resonator; a CW resonance tracking electronics module operatively coupled to the gyro resonator; and a CCW resonance tracking electronics module operatively coupled to the gyro resonator; wherein the second cavity length is longer than the first cavity length by a ratio of up to about 200 to 1, the first and second fiber optic coils are composed of the same optical material and have the same construction, and the first and second piezoelectric cores are composed of the same piezoelectric material; wherein the reference resonator is operatively coupled to the CW resonance tracking electronics module to automatically adjust a resonance frequency of the reference resonator to substantially correspond with a resonance frequency of the gyro resonator.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A resonator fiber optic gyroscope (RFOG), comprising:
   a master laser configured to emit a reference optical signal;
   a first slave laser configured to emit a clockwise (CW) optical signal, the first slave laser responsive to the reference optical signal through a CW optical phase lock loop;
   a second slave laser configured to emit a counter-clockwise (CCW) optical signal, the second slave laser responsive to the reference optical signal through a CCW optical phase lock loop;
   a reference resonator in optical communication with the master laser and configured to receive the reference optical signal, the reference resonator comprising a first fiber optic coil having a first cavity length; and
   a gyro resonator in optical communication with the first slave laser and the second slave laser, the gyro resonator configured to receive the CW and CCW optical signals, the gyro resonator comprising a second fiber optic coil having a second cavity length that is longer than the first cavity length of the first fiber optic coil;
   a first phase modulator comprising a first piezoelectric core wound with a portion of the first fiber optic coil of the reference resonator;
   a second phase modulator comprising a second piezoelectric core wound with a portion of the second fiber optic coil of the gyro resonator;
   a CW resonance tracking electronics module operatively coupled to the gyro resonator; and
   a CCW resonance tracking electronics module operatively coupled to the gyro resonator;
   wherein the reference resonator is operatively coupled to the CW resonance tracking electronics module to adjust a resonance frequency of the reference resonator to substantially correspond with a resonance frequency of the gyro resonator, such that the reference resonator has an operating frequency that substantially tracks with an operating frequency of the gyro resonator.

2. The RFOG of claim 1, wherein the second cavity length is longer than the first cavity length by a ratio of at least about 10 to 1.

3. The RFOG of claim 1, wherein the second cavity length is longer than the first cavity length by a ratio of up to about 200 to 1.

4. The RFOG of claim 1, wherein the first and second fiber optic coils have substantially the same thermal expansion coefficient.

5. The RFOG of claim 4, wherein the first and second fiber optic coils are composed of the same optical material and have the same construction.

6. The RFOG of claim 5, wherein:
   the first and second piezoelectric cores are composed of the same piezoelectric material.

7. The RFOG of claim 1, wherein the master laser, the first slave laser, and the second slave laser are implemented in a multi frequency laser source.

8. The RFOG of claim 7, wherein the multi frequency laser source comprises a set of distributed feedback lasers incorporated in an integrated photonics chip.

9. The RFOG of claim 8, wherein the reference resonator is in optical communication with the master laser through a first optical bench chip.

10. The RFOG of claim 9, wherein the gyro resonator is in optical communication with the first and second slave lasers through a second optical bench chip.

11. The RFOG of claim 1, wherein a reflected optical signal from the reference resonator is directed to a feedback laser stabilization loop for the master laser that includes a Pound-Drever-Hall (PDH) servo modulation frequency scheme.

12. The RFOG of claim 1, wherein the operating frequency of the reference resonator automatically tracks the operating frequency of the gyro resonator.

13. The RFOG of claim 1, wherein the CW resonance tracking electronics module includes a first servo that outputs a frequency command signal that is directed to an input of a second servo, which outputs an electrical voltage signal to the first phase modulator to adjust the resonance frequency of the reference resonator.

14. The RFOG of claim 1, further comprising one or more heaters operatively coupled with the first fiber optic coil to provide for thermal tuning of the reference resonator with respect to a temperature gradient during operation of the RFOG.

15. The RFOG of claim 1, further comprising one or more heaters operatively coupled with the second fiber optic coil to provide for thermal tuning of the gyro resonator with respect to a temperature gradient during operation of the RFOG.

16. A resonator fiber optic gyroscope (RFOG), comprising:
a master laser that emits a reference optical signal;
a first slave laser that emits a clockwise (CW) optical signal, the first slave laser responsive to the reference optical signal through a CW optical phase lock loop;
a second slave laser that emits a counter-clockwise (CCW) optical signal, the second slave laser responsive to the reference optical signal through a CCW optical phase lock loop;
a reference resonator in optical communication with the master laser and configured to receive the reference optical signal, the reference resonator comprising a first fiber optic coil having a first cavity length; and
a gyro resonator in optical communication with the first slave laser and the second slave laser, the gyro resonator configured to receive the CW optical signal and the CCW optical signal, the gyro resonator comprising a second fiber optic coil having a second cavity length that is longer than the first cavity length of the first fiber optic coil;
a first phase modulator comprising a first piezoelectric core wound with a portion of the first fiber optic coil of the reference resonator;
a second phase modulator comprising a second piezoelectric core wound with a portion of the second fiber optic coil of the gyro resonator;
a CW resonance tracking electronics module operatively coupled to the gyro resonator; and
a CCW resonance tracking electronics module operatively coupled to the gyro resonator;
wherein the second cavity length is longer than the first cavity length by a ratio of up to about 200 to 1, the first and second fiber optic coils are composed of the same optical material and have the same construction, and the first and second piezoelectric cores are composed of the same piezoelectric material;
wherein the reference resonator is operatively coupled to the CW resonance tracking electronics module to automatically adjust a resonance frequency of the reference resonator to substantially correspond with a resonance frequency of the gyro resonator.

17. The RFOG of claim 16, further comprising one or more heaters operatively coupled with the first fiber optic coil to provide for thermal tuning of the reference resonator with respect to a temperature gradient during operation of the RFOG.

18. The RFOG of claim 17, further comprising one or more heaters operatively coupled with the second fiber optic coil to provide for thermal tuning of the gyro resonator with respect to a temperature gradient during operation of the RFOG.

\* \* \* \* \*